US012084206B2

(12) United States Patent
Winer (10) Patent No.: US 12,084,206 B2
(45) Date of Patent: Sep. 10, 2024

(54) OFFSET COMPENSATED PHOTODIODE AMPLIFIER (71) Applicant: GOODRICH CORPORATION, Charlotte, NC (US)

(72) Inventor: Gordon Elliott Winer, Prescott, AZ (US)

(73) Assignee: GOODRICH CORPORATION, Charlotte, NC (US)

( * ) Notice: Subject to any disclaimer, the term of this patent is extended or adjusted under 35 U.S.C. 154(b) by 844 days.

(21) Appl. No.: 17/135,471

(22) Filed: Dec. 28, 2020

(65) Prior Publication Data
US 2022/0204185 A1 Jun. 30, 2022

(51) Int. Cl.
*B64F 5/60* (2017.01)
*G01J 1/16* (2006.01)
*G01J 1/44* (2006.01)
*G01K 11/12* (2021.01)
*H03F 3/45* (2006.01)

(52) U.S. Cl.
CPC .............. *B64F 5/60* (2017.01); *G01J 1/1626* (2013.01); *G01J 1/44* (2013.01); *G01K 11/12* (2013.01); *G01J 2001/444* (2013.01); *G01J 2001/446* (2013.01); *H03F 3/45968* (2013.01); *H03F 3/45973* (2013.01); *H03F 3/45977* (2013.01)

(58) Field of Classification Search
CPC ... B64F 5/60; G01J 1/1626; G01J 1/44; G01J 2001/444; G01J 2001/446; G01J 1/0228; G01J 5/0014; G01K 11/12; H04N 25/63; H04N 25/671; H04N 25/673; H04N 25/778
See application file for complete search history.

(56) References Cited

U.S. PATENT DOCUMENTS 4,914,519 A * 4/1990 Hashimoto ............ H04N 25/67
348/E5.079
6,501,282 B1 * 12/2002 Dummermuth ....... G01P 15/125
324/658
7,045,752 B2 5/2006 Posamentier et al.
(Continued)

FOREIGN PATENT DOCUMENTS

CN 108036728 5/2018
JP 2007044415 2/2007
WO 2009019467 2/2009

OTHER PUBLICATIONS

European Patent Office; European Search Report dated May 4, 2022 in Application No. 21216282.0.
(Continued)

*Primary Examiner* — Thanh Luu
*Assistant Examiner* — Monica T Taba
(74) *Attorney, Agent, or Firm* — SNELL & WILMER L.L.P.

(57) ABSTRACT

A system for compensating for photodiode errors includes a live photodiode configured to be exposed to a light source and to output a live signal. The system further includes a reference photodiode located proximate to the live photodiode and configured to be isolated from the light source and to output a reference signal. The system further includes a controller configured to generate a compensated output signal by subtracting the reference signal from the live signal.

18 Claims, 6 Drawing Sheets

(56) References Cited

U.S. PATENT DOCUMENTS

| | | |
|---|---|---|
| 7,268,815 B1 * | 9/2007 | Meynants .......... H04N 3/1568 |
| | | 348/E5.081 |
| 7,671,320 B2 | 3/2010 | Hirose et al. |
| 7,842,243 B2 | 11/2010 | Sarkisov et al. |
| 8,921,754 B2 | 12/2014 | Frach |
| 9,462,168 B2 | 10/2016 | Wilks et al. |
| 2001/0009268 A1 | 7/2001 | Marius et al. |
| 2003/0080294 A1 | 5/2003 | Kevin et al. |
| 2007/0013793 A1 * | 1/2007 | Konda ................ G06V 20/588 |
| | | 348/241 |
| 2010/0060562 A1 * | 3/2010 | Hadwen ............ H01L 31/02164 |
| | | 250/208.2 |
| 2020/0300468 A1 * | 9/2020 | Kramer ................ G01J 5/0014 |

OTHER PUBLICATIONS

European Patent Office, European Office Action dated Nov. 22, 2023 in Application No. 21216282.0.

* cited by examiner

OFFSET COMPENSATED PHOTODIODE AMPLIFIER

FIELD

The present disclosure relates generally to optical temperature sensors for use in gas turbine engines and, more particularly, to photodiode-based light sensors.

BACKGROUND

Gas turbine engines typically include a compressor section, a combustor section and a turbine section. The compressor section and turbine section may include various airfoils, and the combustor section may include various additional components. It may be desirable to determine a temperature of one or more component of a gas turbine engine. Photodiodes may be usable to determine such temperatures. However, photodiodes may experience error signals due to various effects. For example, exposure of photodiodes to relatively high temperatures may increase dark current output by the photodiode, thus affecting the signal usable to determine the temperature detected by the photodiode.

SUMMARY

Described herein is a system for compensating for photodiode errors and errors in its associated transconductance amplifier. The system includes a live photodiode configured to be exposed to a light source and to output a live signal. The system further includes a reference photodiode located proximate to the live photodiode and configured to be isolated from the light source and to output a reference signal. The system further includes a controller configured to generate a compensated output signal by subtracting the reference signal from the live signal.

Any of the foregoing embodiments may further include a photodiode switch having a first position to electrically connect the live photodiode to the controller and electrically isolate the reference photodiode from the controller, and a second position to electrically connect the reference photodiode to the controller and to electrically isolate the live photodiode from the controller.

In any of the foregoing embodiments, controller includes a live sample and hold circuit configured to receive and store the live signal in response to the photodiode switch being in the first position, and a reference sample and hold circuit configured to receive and store the reference signal in response to the photodiode switch being in the second position.

In any of the foregoing embodiments, the controller further includes a difference amplifier configured to subtract the reference signal from the live signal and to output the compensated output signal.

In any of the foregoing embodiments, the controller further includes an operational amplifier that functions as a transconductance amplifier and is configured to amplify and output the live signal in response to the photodiode switch being in the first position, and to amplify and output the reference signal in response to the photodiode switch being in the second position; and the compensated output signal further compensates for errors caused by the operational amplifier.

Any of the foregoing embodiments may further include a live sample switch located in the live sample and hold circuit and configured to be closed in response to the photodiode switch being in the first position and open in response to the photodiode switch being in the second position; and a reference sample switch located in the reference sample and hold circuit and configured to be closed in response to the photodiode switch being in the second position and open in response to the photodiode switch being in the first position.

In any of the foregoing embodiments, each of the photodiode switch, the live sample switch, and the reference sample switch alternate at a same frequency that is between 100 hertz and 1 Megahertz.

In any of the foregoing embodiments, the live photodiode and the reference photodiode include the same electrical properties.

In any of the foregoing embodiments, the live photodiode and the reference photodiode are configured to be located in a gas turbine engine and the light source is an airfoil of the gas turbine engine.

In any of the foregoing embodiments, the live signal corresponds to a temperature of the airfoil.

In any of the foregoing embodiments, the compensated output signal compensates for error signals including dark current and shunt resistance experienced by the live photodiode.

Also disclosed is a system for compensating for photodiode errors. The system includes a live photodiode configured to be exposed to a light source and to output a live signal. The system further includes a reference photodiode located proximate to the live photodiode and configured to be isolated from the light source and to output a reference signal. The system further includes a difference amplifier configured to generate a compensated output signal by subtracting the reference signal from the live signal.

Any of the foregoing embodiments may further include a photodiode switch having a first position to electrically connect the live photodiode to the controller and electrically isolate the reference photodiode from the difference amplifier, and a second position to electrically connect the reference photodiode to the controller and to electrically isolate the live photodiode from the difference amplifier.

Any of the foregoing embodiments may further include a live sample and hold circuit configured to receive and store the live signal in response to the photodiode switch being in the first position; and a reference sample and hold circuit configured to receive and store the reference signal in response to the photodiode switch being in the second position.

Any of the foregoing embodiments may further include an operational amplifier configured to amplify and output the live signal in response to the photodiode switch being in the first position, and to amplify and output the reference signal in response to the photodiode switch being in the second position.

Any of the foregoing embodiments may further include a live sample switch located in the live sample and hold circuit and configured to be closed in response to the photodiode switch being in the first position and open in response to the photodiode switch being in the second position; and a reference sample switch located in the reference sample and hold circuit and configured to be closed in response to the photodiode switch being in the second position and open in response to the photodiode switch being in the first position.

Also disclosed is a method for compensating for photodiode errors. The method includes outputting, by a live photodiode exposed to a light source, a live signal. The method further includes outputting, by a reference photodiode proximate to the live photodiode and isolated from the light source, a reference signal. The method further includes generating, by a controller, a compensated output signal by subtracting the reference signal from the live signal.

Any of the foregoing embodiments may further include alternating a photodiode switch between a first position to electrically connect the live photodiode to the controller and electrically isolate the reference photodiode from the controller, and a second position to electrically connect the reference photodiode to the controller and to electrically isolate the live photodiode from the controller.

In any of the foregoing embodiments, the photodiode switch alternates at a frequency that is between 100 hertz and 1 Megahertz.

In any of the foregoing embodiments, the live photodiode and the reference photodiode are both located in a gas turbine engine, and the live signal corresponds to a temperature of an airfoil of the gas turbine engine.

The foregoing features and elements are to be combined in various combinations without exclusivity, unless expressly indicated otherwise. These features and elements as well as the operation thereof will become more apparent in light of the following description and the accompanying drawings. It should be understood, however, the following description and drawings are intended to be exemplary in nature and non-limiting.

BRIEF DESCRIPTION OF THE DRAWINGS

The subject matter of the present disclosure is particularly pointed out and distinctly claimed in the concluding portion of the specification. A more complete understanding of the present disclosure, however, is best be obtained by referring to the detailed description and claims when considered in connection with the drawing figures, wherein like numerals denote like elements.

DETAILED DESCRIPTION

The detailed description of exemplary embodiments herein makes reference to the accompanying drawings, which show exemplary embodiments by way of illustration and their best mode. While these exemplary embodiments are described in sufficient detail to enable those skilled in the art to practice the inventions, it should be understood that other embodiments may be realized and that logical, chemical and mechanical changes may be made without departing from the spirit and scope of the inventions. Thus, the detailed description herein is presented for purposes of illustration only and not of limitation. For example, the steps recited in any of the method or process descriptions may be executed in any order and are not necessarily limited to the order presented. Furthermore, any reference to singular includes plural embodiments, and any reference to more than one component or step may include a singular embodiment or step. Also, any reference to attached, fixed, connected or the like may include permanent, removable, temporary, partial, full and/or any other possible attachment option. Additionally, any reference to without contact (or similar phrases) may also include reduced contact or minimal contact. Where used herein, the phrase "at least one of A or B" can include any of "A" only, "B" only, or "A and B."

Figure 1:
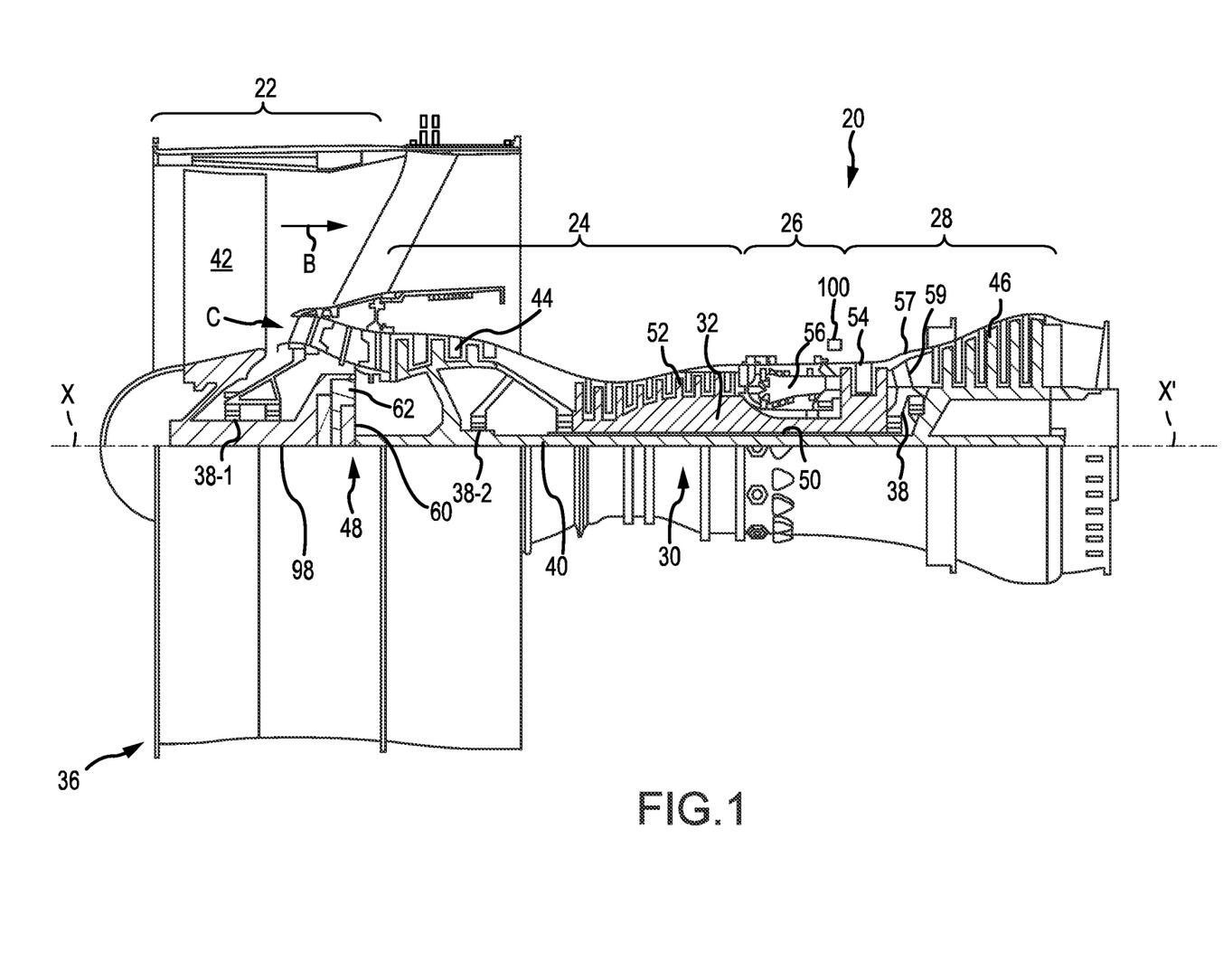
FIG. 1 is a cross-sectional view of an exemplary gas turbine engine, in accordance with various embodiments.

With reference to FIG. 1, a gas turbine engine 20 is provided. As used herein, "aft" refers to the direction associated with the tail (e.g., the back end) of an aircraft, or generally, to the direction of exhaust of the gas turbine engine. As used herein, "forward" refers to the direction associated with the nose (e.g., the front end) of an aircraft, or generally, to the direction of flight or motion. As utilized herein, radially inward refers to the negative R direction and radially outward refers to the R direction.

The gas turbine engine 20 may be a two-spool turbofan that generally incorporates a fan section 22, a compressor section 24, a combustor section 26 and a turbine section 28. In operation, the fan section 22 drives air along a bypass flow-path B while the compressor section 24 drives air along a core flow-path C for compression and communication into the combustor section 26 then expansion through the turbine section 28. Although depicted as a turbofan gas turbine engine 20 herein, it should be understood that the concepts described herein are not limited to use with turbofans as the teachings may be applied to other types of turbine engines including three-spool architectures and turboshaft or industrial gas turbines with one or more spools.

The gas turbine engine 20 generally comprise a low speed spool 30 and a high speed spool 32 mounted for rotation about an engine central longitudinal axis X-X' relative to an engine static structure 36 via several bearing systems 38, 38-1, and 38-2. It should be understood that various bearing systems 38 at various locations may alternatively or additionally be provided, including for example, the bearing system 38, the bearing system 38-1, and the bearing system 38-2.

The low speed spool 30 generally includes an inner shaft 40 that interconnects a fan 42, a low pressure (or first) compressor section 44 and a low pressure (or second) turbine section 46. The inner shaft 40 is connected to the fan 42 through a geared architecture 48 that can drive the fan shaft 98, and thus the fan 42, at a lower speed than the low speed spool 30. The geared architecture 48 includes a gear assembly 60 enclosed within a gear housing 62. The gear assembly 60 couples the inner shaft 40 to a rotating fan structure.

The high speed spool 32 includes an outer shaft 50 that interconnects a high pressure (or second) compressor section 52 and the high pressure (or first) turbine section 54. A combustor 56 is located between the high pressure compressor 52 and the high pressure turbine 54. A mid-turbine frame 57 of the engine static structure 36 is located generally between the high pressure turbine 54 and the low pressure turbine 46. The mid-turbine frame 57 supports one or more bearing systems 38 in the turbine section 28. The inner shaft 40 and the outer shaft 50 are concentric and rotate via bearing systems 38 about the engine central longitudinal axis X-X', which is collinear with their longitudinal axes. As used herein, a "high pressure" compressor or turbine experiences a higher pressure than a corresponding "low pressure" compressor or turbine.

The core airflow C is compressed by the low pressure compressor section 44 then the high pressure compressor 52, mixed and burned with fuel in the combustor 56, then expanded over the high pressure turbine 54 and the low pressure turbine 46. The mid-turbine frame 57 includes airfoils 59 which are in the core airflow path. The turbines 46, 54 rotationally drive the respective low speed spool 30 and high speed spool 32 in response to the expansion.

The gas turbine engine 20 is a high-bypass ratio geared aircraft engine. The bypass ratio of the gas turbine engine 20 may be greater than about six (6). The bypass ratio of the gas turbine engine 20 may also be greater than ten (10:1). The geared architecture 48 may be an epicyclic gear train, such as a star gear system (sun gear in meshing engagement with a plurality of star gears supported by a carrier and in meshing engagement with a ring gear) or other gear system. The geared architecture 48 may have a gear reduction ratio of greater than about 2.3 and the low pressure turbine 46 may have a pressure ratio that is greater than about five (5). The diameter of the fan 42 may be significantly larger than that of the low pressure compressor section 44, and the low pressure turbine 46 may have a pressure ratio that is greater than about five (5:1). The pressure ratio of the low pressure turbine 46 is measured prior to an inlet of the low pressure turbine 46 as related to the pressure at the outlet of the low pressure turbine 46. It should be understood, however, that the above parameters are exemplary of various embodiments of a suitable geared architecture engine and that the present disclosure contemplates other turbine engines including direct drive turbofans.

The next generation turbofan engines are designed for higher efficiency and use higher pressure ratios and higher temperatures in the high pressure compressor 52 than are conventionally experienced. These higher operating temperatures and pressure ratios create operating environments that cause thermal loads that are higher than the thermal loads conventionally experienced, which may shorten the operational life of current components.

In various embodiments, the gas turbine engine 20 may further include a photodiode system 100 designed to detect a light intensity. The light intensity may correspond to a temperature of the component from which the light emanates. For example, the light source may include an airfoil or other component in the turbine section 28, an airfoil or other component in the compressor section 24, a component in the combustor section 26, or the like.

Figure 2:
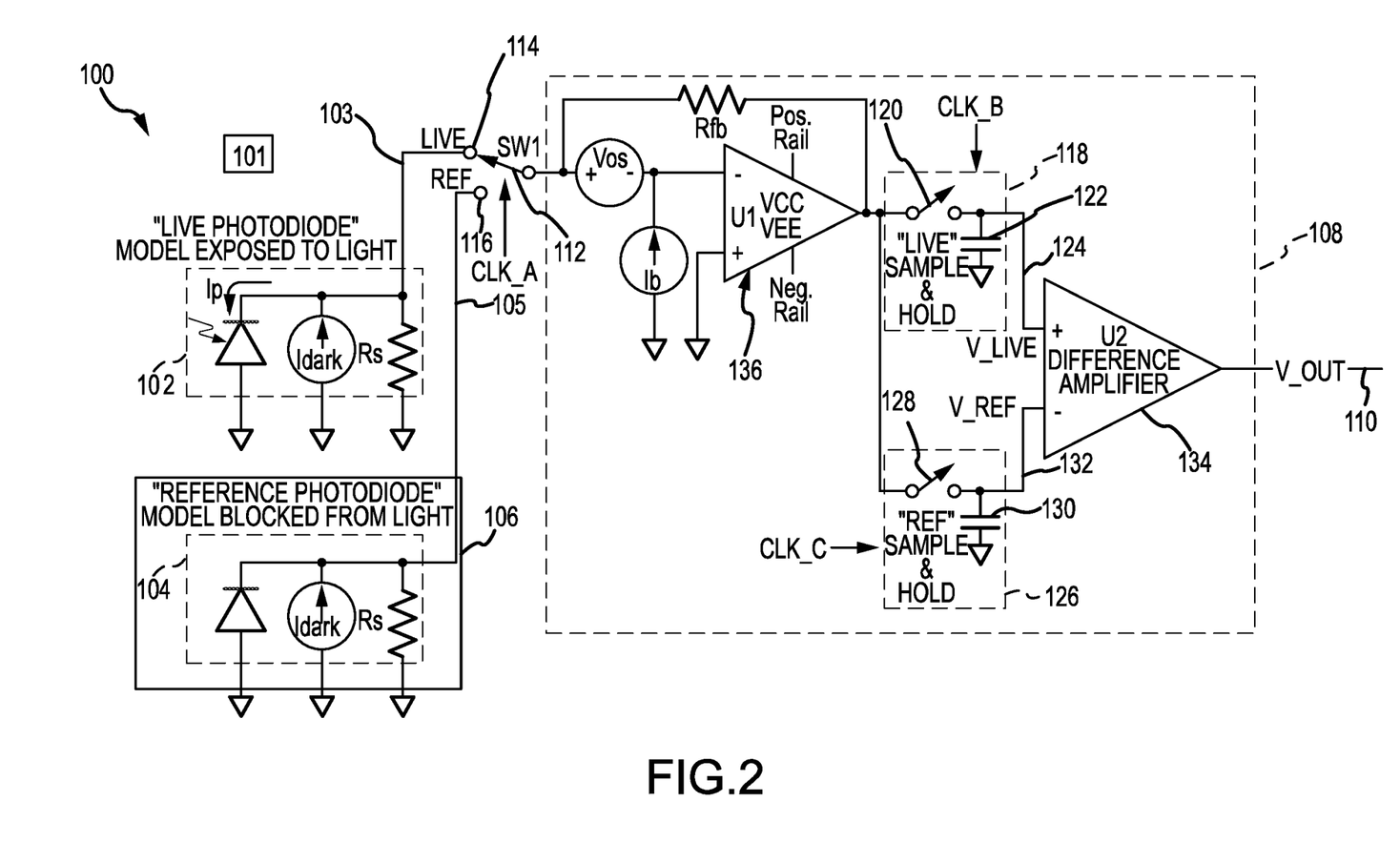
FIG. 2 is a block diagram illustrating a system for compensating for photodiode errors of a photodiode usable to detect light emitted or reflected by a component of the gas turbine engine of FIG. 1, in accordance with various embodiments.
Figure 3A:
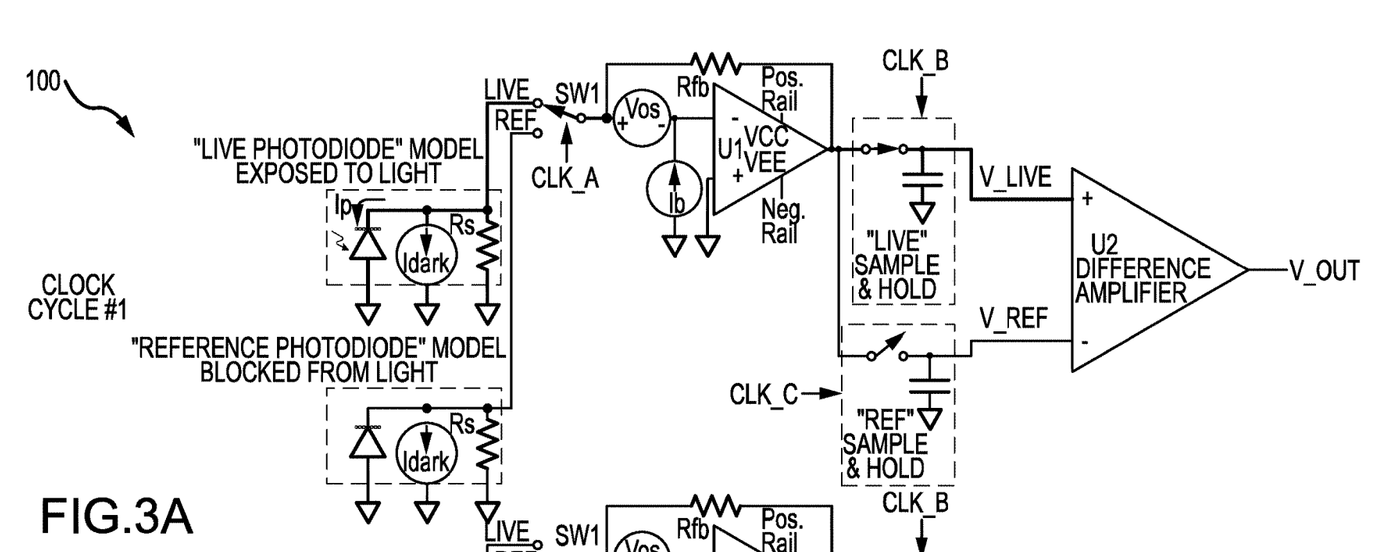
FIGS. 3A and 3B are drawings illustrating operation of the system of FIG. 2, in accordance with various embodiments.
Figure 3B:
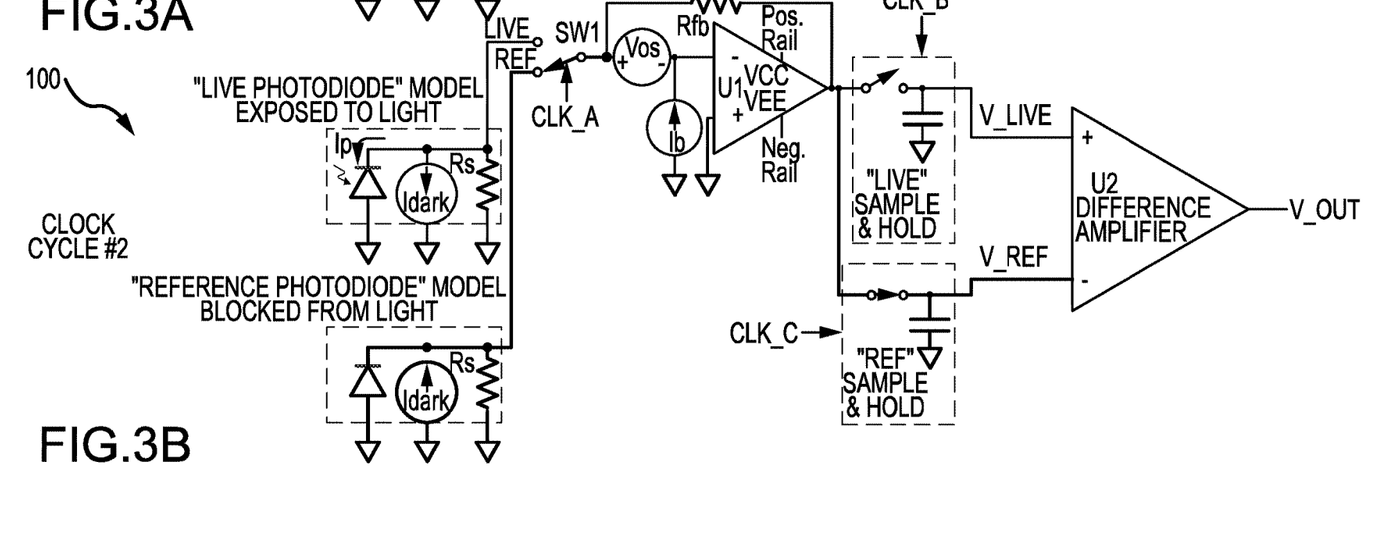

Referring now to FIGS. 2, 3A, and 3B, the photodiode system 100 may include a live photodiode 102 and a reference photodiode 104. The live photodiode 102 may be exposed to a light source 101 (e.g., an airfoil such as a turbine blade, a compressor rotor, or the like) such that the light detected by the live photodiode 102 corresponds to a temperature of the light source 101. The signal output by the live photodiode 102 may be, for example, electrical current signals and may correspond to a temperature of the light source 101. In that regard, the value of the current signal output by the live photodiode may relate to the temperature of the light source 101.

However, error signals may also be present in the output of the live photodiode 102. For example, the error signals may include a photodiode shunt resistance, a photodiode dark current (which both are affected by temperatures experienced by a photodiode), an op-amp input offset voltage (e.g., of a transconductance amplifier), and an op-amp input bias current. In that regard, the photodiode system 100 may be designed to compensate for such error signals.

As part of the compensation, the photodiode system 100 may include the reference photodiode 104. The reference photodiode 104 may be located behind a light blocker 106 which blocks light from the light source 101 from reaching the reference photodiode 104. In various embodiments, the reference photodiode 104 may be optically isolated from any light source, from any major light source, or the like. It may be desirable for any optical blocker used for the reference photodiode 104 to have minimal effect on temperatures to which the reference photodiode is exposed. The live photodiode 102 may output a live signal 103 and the reference photodiode 104 may output a reference signal 105.

The photodiode system 100 may further include a controller 108. The controller 108 may include a logic device such as one or more of a central processing unit (CPU), an accelerated processing unit (APU), a digital signal processor (DSP), a field programmable gate array (FPGA), an application specific integrated circuit (ASIC), or any other device capable of implementing logic. In various embodiments, the controller 108 may further include any non-transitory memory known in the art. The memory may store instructions usable by the logic device to perform operations as described herein.

The controller 108 may determine a difference between the live signal 103 and the reference signal 105 by subtracting the reference signal 105 from the live signal 103. Stated differently, the controller 108 may output a compensated output signal 110 by subtracting the reference signal 105 from the live signal 103. Because the live photodiode 102 and the reference photodiode 104 have the same electrical properties (e.g., by having the same part number), and because the reference photodiode 104 is blocked from the light source 101, any signal generated by the reference photodiode 104 corresponds to an error signal which may be the same error signal generated by the live photodiode 102. In that regard, subtracting the reference signal 105 from the live signal 103 results in a signal that references the temperature of the light source 101 without significant error.

The photodiode system 100 may further include a photodiode switch 112. The photodiode switch may switch between a first position 114 in which the live photodiode 102 is connected to the controller 108 and the reference photodiode 104 is disconnected from the controller 108, and a second position 116 in which the live photodiode is disconnected from the controller 108 and the reference photodiode 104 is connected to the controller 108.

The controller 108 may further include an operational amplifier 136. The operational amplifier 136 may receive the live signal 103 in response to the photodiode switch 112 being in the first position 114 and may receive the reference signal 105 in response to the photodiode switch 112 being in the second position 116. The operational amplifier 136 may amplify the received signal.

The controller 108 may include a live sample and hold circuit 118. The live sample and hold circuit 118 may receive the output of the operational amplifier 136 which may include an amplified live signal 103 and an amplified reference signal 105. In particular, the live sample and hold circuit 118 may have a storage element that receives a signal corresponding to the live signal 103 in response to the photodiode switch 112 being in the first position 114, and may hold and output a live held signal 124 in response to the photodiode switch 112 being the second position 116.

In particular, the live sample and hold circuit 118 may include a live sample switch 120 that closes in response to the photodiode switch 112 being in the first position 114 (to allow the amplified live signal 103 to be received by a storage element of the live sample and hold circuit 118). The live sample switch 120 may further open (to allow the live held signal 124 to be held) in response to the photodiode switch 112 being in the second position 116. In that regard, the live sample switch 120 may be closed in response to the photodiode switch 112 being in the first position 114 and open in response to the photodiode switch 112 being in the second position 116.

The live sample and hold circuit 118 may further include a storage element, such as a live sample capacitor 122, to hold the live held signal 124 in response to the live sample switch 120 being open.

The controller 108 may further include a reference sample and hold circuit 126. The reference sample and hold circuit 126 may receive the output of the operational amplifier 136 which may include an amplified live signal 103 and an amplified reference signal 105. In particular, the reference sample and hold circuit 126 may have a storage element that receives a signal corresponding to the reference signal 105 in response to the photodiode switch 112 being in the second position 116, and may hold and output a reference held signal 132 in response to the photodiode switch being in the first position 114.

In particular, the reference sample and hold circuit 126 may include a reference sample switch 128 that opens in response to the photodiode switch being in the first position 114 (to allow the reference held signal 132 to be held). The reference sample switch 128 may further close in response to the photodiode switch 112 being in the second position 116 (to allow the amplified reference signal 105 to be received by a storage element of the reference sample and hold circuit 126). The reference sample and hold circuit 126 may further include a storage element, such as a reference sample capacitor 130, to hold the reference held signal 132 in response to the reference sample switch 128 being open.

The controller 108 may further include a difference amplifier 134. The difference amplifier 134 may receive two signals and calculate a difference therebetween. In particular, the difference amplifier 134 may receive the live held signal 124 and the reference held signal 132. The difference amplifier 134 may then subtract the reference held signal 132 from the live held signal 124 and output the difference as a compensated output signal 110.

The compensated output signal 110 may compensate for the errors experienced by the live photodiode 102. This is because the live held signal 124 includes error signals and the signal representing the intensity of the light source 101, and the reference held signal 132 includes similar error signals without any signal corresponding to the light source 101. Thus, the compensated output signal 110 may include only signals that represent the intensity of the light source 101 because any error signals corresponding to the live held signal 124 are compensated for by subtracting the signal from the reference held signal 132. Furthermore, use of the switches 112, 120, 128 reduces the likelihood of additional errors being introduced by using different devices in the controller 108.

The photodiode switch 112, the live sample switch 120, and the reference sample switch 128 may be switch at a same frequency. For example, the switches 112, 120, 128 may be coupled to a same clock or to different clocks that operate at a same frequency. The frequency may be, for example, between 100 hertz and 5 Megahertz, between 1 Kilohertz and 3 Megahertz, between 1 Kilohertz and 1 Megahertz, or the like.

Use of the switches 112, 120, 128 allows the same operational amplifier 136 to be used in calculating both the live held signal 124 and the reference held signal 132. This reduces any error in the compensated output signal 110 due to variance in operational amplifiers (should more than one be used).

Because the switches 112, 120, 128 are continually switching (and, thus, the live held signal 124 and the reference held signal 132 are continually updating), the difference amplifier 134 continually updates the compensated output signal 110. Thus, the compensated output signal 110 continually outputs a near-real-time value corresponding to the temperature of the light source 101.

Referring now to FIGS. 2, 3A, and 3B, operation of the system 100 is shown. In particular, FIG. 3A illustrates the system 100 during a first clock cycle (in which the photodiode switch 112 is in the first position 114). As shown, the live signal 103 is amplified by the operational amplifier 136 and is transferred to the live sample capacitor 122 via the live sample switch. At the same time, the reference sample switch 128 is open so the reference sample capacitor 130 holds a previously-detected and amplified reference signal 105.

FIG. 3B illustrates the system 100 during a second clock cycle that is opposite the first clock cycle (in which the photodiode switch 112 is in the second position 116). As shown, the reference signal 105 is amplified by the operational amplifier and is transferred to the reference sample capacitor 130 via the reference sample switch. At the same time, the live sample switch 120 is open so the live sample capacitor 122 holds the amplified live signal 103 from the clock cycle of FIG. 3A.

Figure 4:
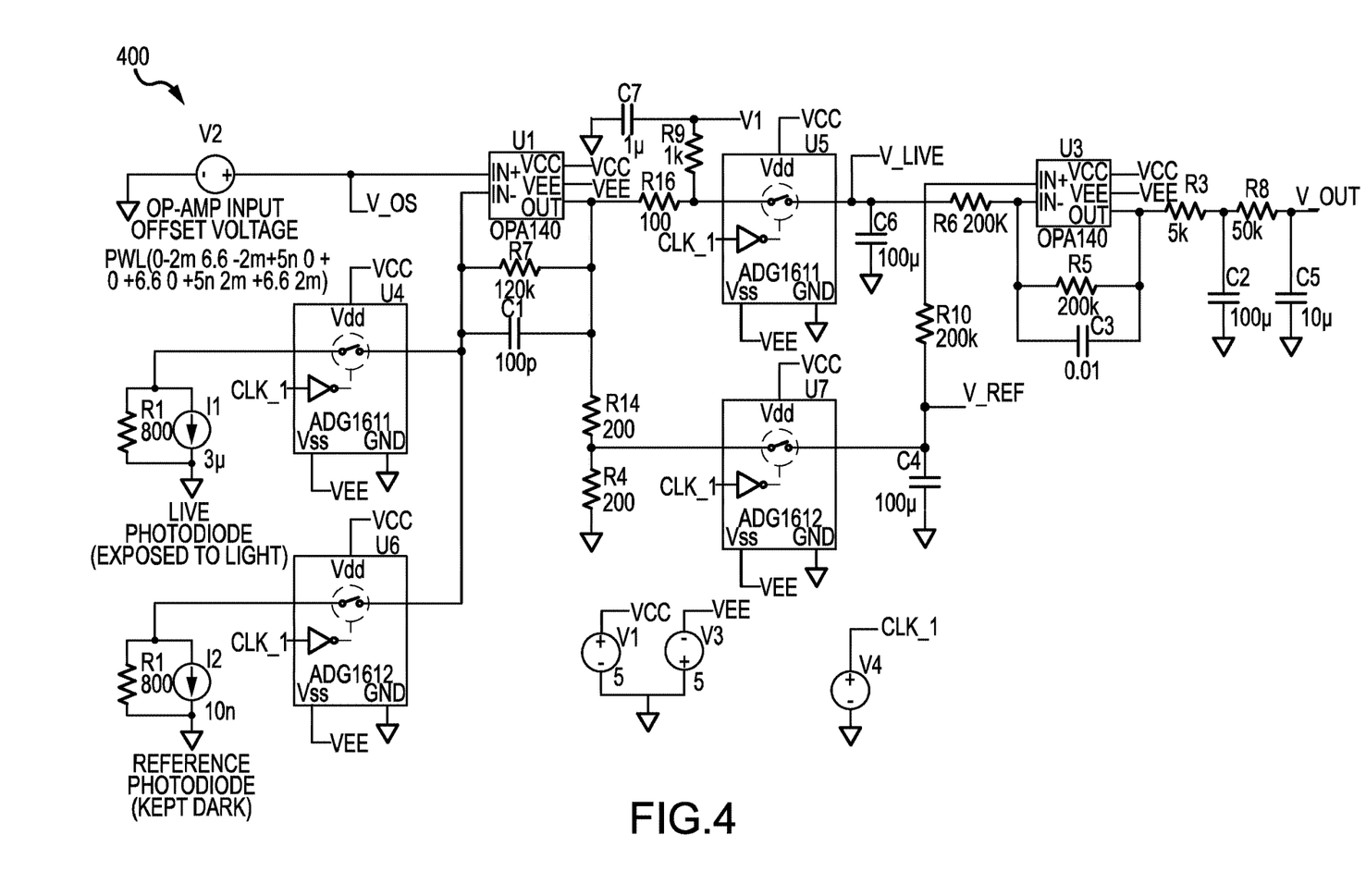
FIG. 4 is a drawing illustrating an exemplary simulation setup to test the system of FIG. 2, in accordance with various embodiments.
Figure 5:
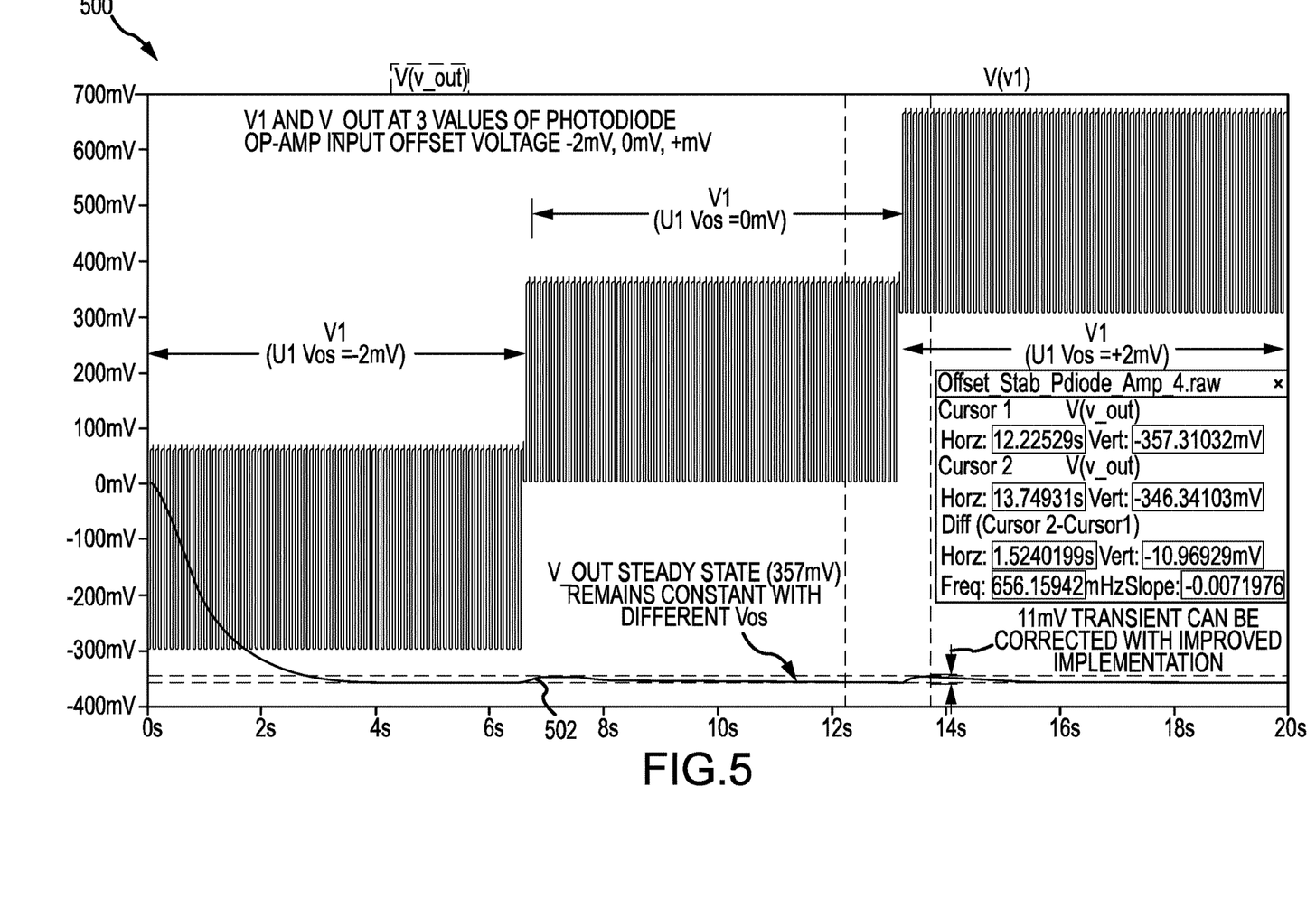
FIG. 5 is a graph illustrating the results of the simulation of FIG. 4, in accordance with various embodiments.

Referring to FIGS. 2, 4, and 5, a model 400 of the system 100 of FIG. 2 was created using an advanced circuit simulation software, available under the trade name LTspice®, available from Analog Devices Corp. of Norwood, Massachusetts. As shown in a graph 500, three values of V1 corresponding to operational amplifier offset voltage. As shown, the output voltage significantly rejects the error caused by the operational amplifier input offset voltage, photodiode dark current, the interaction of photodiode shunt resistance with operational amplifier input voltage offset voltage where the shunt resistance forms a voltage amplifier with the operational amplifier feedback resistor, and operational amplifier input bias current. As shown, a line 502 representing the compensated output signal 110 remains relatively constant after a brief ramp-up period, indicating that any error signals that would be experienced by the live photodiode 102 and the reference photodiode 104 are compensated for by the system 100.

Figure 6:
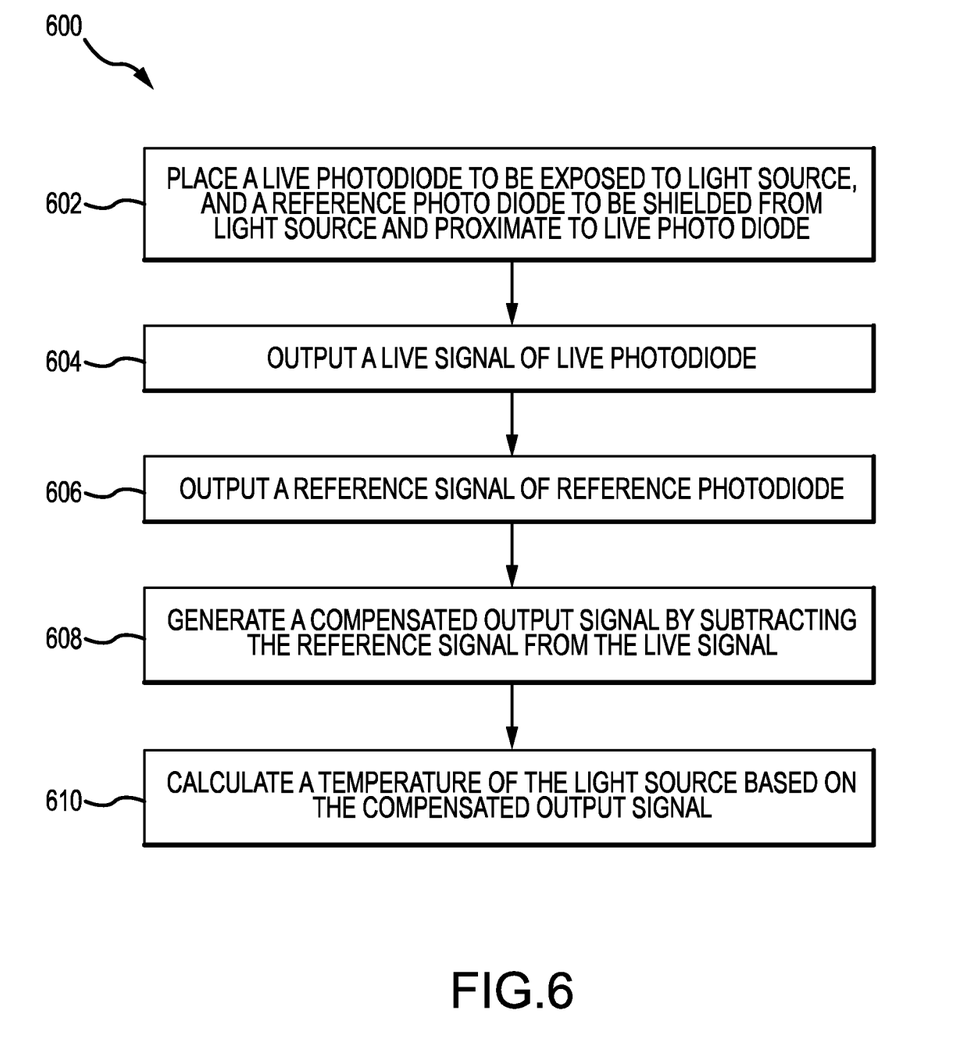
FIG. 6 is a flowchart illustrating a method for compensating for photodiode errors of a photodiode usable to detect a temperature of a component of a gas turbine engine and for compensating for errors in a corresponding transconductance amplifier, in accordance with various embodiments.

Referring now to FIG. 6, a method 600 for compensating for photodiode errors is shown. The method 600 may be implemented by a system similar to the system 100 of FIG. 2. For example, the method 600 may be used to compensate for photodiode errors experienced by a photodiode used in a gas turbine engine to detect a temperature of an airfoil used in the gas turbine engine.

In block 602, a live photodiode may be positioned in a location in which it is exposed to a light source. For example, the live photodiode may be positioned such that light from an airfoil is directed towards the live photodiode. Similarly, a reference photodiode may be placed in such a location that it is shielded from the light generated by the light source. For example, the reference photodiode may be positioned such that it is optically isolated from other components. The live photodiode and the reference photodiode may also be positioned relatively proximate to each other (e.g., within 1 inch (2.54 centimeters (cm)), within 0.5 inches (1.27 cm), within 0.1 inches (0.254 cm), within 0.01 inches (0.0254 cm), or the like. The reference photodiode may be positioned sufficiently proximate to the live photodiode that it is exposed to relatively similar temperatures. For example, the reference photodiode may be positioned sufficiently close to the live photodiode that it is exposed to temperatures that are within 10 percent (10%), within 5%, within 3%, within 1%, or the like of the temperatures experienced by the live photodiode. This increases the likelihood that the system accurately compensates for errors experienced by the live photodiode.

In block 604, the live photodiode may output a live signal. The live signal may be a current signal that corresponds to light from the light source that is detected by the live photodiode. The live signal may include the light-based signal that is related to the light intensity of the light source (and thus corresponds to the temperature of the light source), and may further include error signals as discussed above.

In block 606, the reference photodiode may output a reference signal. The reference signal may likewise be a current signal. Because the reference photodiode is optically isolated from the light source, the reference signal may fail to include a portion related to light detection and, thus, may only include an error signal. Because of the proximity to the live photodiode, the error signal of the reference photodiode may be the same or similar as the error signal of the live photodiode. Thus, the signal generated by the reference photodiode may directly correspond to the error signal of the live photodiode.

An operational amplifier may receive the live signal and the reference signal, such as in an alternating fashion. For example, during a first clock cycle, the operational amplifier may output the amplified live signal and during a second clock cycle, the operational amplifier may output the amplified reference signal.

A live sample and hold circuit may receive the amplified signals and may provide the amplified live signal during the first clock cycle to a storage element, and may isolate the storage element from the amplified reference signal during the second clock cycle (to allow the previously-detected amplified live signal to be output during the second clock cycle). Likewise, a reference sample and hold circuit may receive the amplified signals and may provide the amplified reference signal during the second clock cycle to a storage element, and may isolate the storage element from the amplified live signal during the first clock cycle (to allow the previously-detected amplified reference signal to be output during the first clock cycle). Operation of the circuits may continue to switch between the first clock cycle and the second clock cycle.

In block 608, a controller (e.g., a difference amplifier) may calculate a compensated output signal by subtracting the amplified reference signal from the amplified live signal. The amplified signals may be received from the sample and hold circuits.

In block 610, the controller or another controller may calculate a temperature of the light source based on the compensated output signal that was calculated in block 608. Because the compensated output signal compensates for errors experienced by the live photodiode, the accuracy of the temperature calculation is increased relative to single-photodiode temperature sensors.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the inventions. The scope of the invention is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Different cross-hatching is used throughout the figures to denote different parts but not necessarily to denote the same or different materials.

Systems, methods and apparatus are provided herein. In the detailed description herein, references to "one embodiment", "an embodiment", "various embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f), unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A system for compensating for photodiode errors, the system comprising:
    a live photodiode configured to be exposed to a light source and to output a live signal;
    a reference photodiode located proximate to the live photodiode and configured to be isolated from the light source and to output a reference signal; and
    a controller configured to generate a compensated output signal by subtracting the reference signal from the live signal, wherein the controller comprises an operational amplifier configured to receive and amplify the live signal and receive and amplify the reference signal and wherein the compensated output signal compensates for error signals including dark current affected by temperatures experienced by the live photodiode, shunt resistance experienced by the live photodiode based on an interaction of the live photodiode with an operational amplifier input voltage offset voltage of the operational amplifier where the shunt resistance forms a voltage amplifier with an operational amplifier feedback resistor associated with the operational amplifier, an operational amplifier input offset voltage of the operational amplifier, and an operational amplifier input bias current of the operation amplifier.

2. The system of claim 1, further comprising a photodiode switch having a first position to electrically connect the live photodiode to the controller and electrically isolate the reference photodiode from the controller, and a second position to electrically connect the reference photodiode to the controller and to electrically isolate the live photodiode from the controller.

3. The system of claim 2, wherein the controller includes a live sample and hold circuit configured to receive and store the live signal in response to the photodiode switch being in the first position, and a reference sample and hold circuit configured to receive and store the reference signal in response to the photodiode switch being in the second position.

4. The system of claim 3, wherein the controller further includes a difference amplifier configured to subtract the reference signal from the live signal and to output the compensated output signal.

5. The system of claim 4, wherein the operational amplifier functions as a transconductance amplifier and is configured to amplify and output the live signal in response to the photodiode switch being in the first position, and to amplify and output the reference signal in response to the photodiode switch being in the second position.

6. The system of claim 4, further comprising:
a live sample switch located in the live sample and hold circuit and configured to be closed in response to the photodiode switch being in the first position and open in response to the photodiode switch being in the second position; and
a reference sample switch located in the reference sample and hold circuit and configured to be closed in response to the photodiode switch being in the second position and open in response to the photodiode switch being in the first position.

7. The system of claim 6, wherein each of the photodiode switch, the live sample switch, and the reference sample switch alternate at a same frequency that is between 100 hertz and 1 Megahertz.

8. The system of claim 1, wherein the live photodiode and the reference photodiode include the same electrical properties.

9. The system of claim 1, wherein the live photodiode and the reference photodiode are configured to be located in a gas turbine engine and the light source is an airfoil of the gas turbine engine.

10. The system of claim 9, wherein the live signal corresponds to a temperature of the airfoil.

11. A system for compensating for photodiode errors, the system comprising:
a live photodiode configured to be exposed to a light source and to output a live signal;
a reference photodiode located proximate to the live photodiode and configured to be isolated from the light source and to output a reference signal;
a difference amplifier configured to generate a compensated output signal by subtracting the reference signal from the live signal; and
an operational amplifier configured to amplify and output the live signal in response to a photodiode switch being in a first position and to amplify and output the reference signal in response to the photodiode switch being in a second position, wherein the compensated output signal compensates for error signals including dark current affected by temperatures experienced by the live photodiode, shunt resistance experienced by the live photodiode based on an interaction of the live photodiode with an operational amplifier input voltage offset voltage of the operational amplifier where the shunt resistance forms a voltage amplifier with an operational amplifier feedback resistor associated with the operational amplifier, an operational amplifier input offset voltage of the operational amplifier, and an operational amplifier input bias current of the operation amplifier.

12. The system of claim 11, further comprising the photodiode switch having the first position to electrically connect the live photodiode to a controller and electrically isolate the reference photodiode from the difference amplifier, and the second position to electrically connect the reference photodiode to the controller and to electrically isolate the live photodiode from the difference amplifier.

13. The system of claim 12, further comprising:
a live sample and hold circuit configured to receive and store the live signal in response to the photodiode switch being in the first position; and
a reference sample and hold circuit configured to receive and store the reference signal in response to the photodiode switch being in the second position.

14. The system of claim 13, further comprising:
a live sample switch located in the live sample and hold circuit and configured to be closed in response to the photodiode switch being in the first position and open in response to the photodiode switch being in the second position; and
a reference sample switch located in the reference sample and hold circuit and configured to be closed in response to the photodiode switch being in the second position and open in response to the photodiode switch being in the first position.

15. A method for compensating for photodiode errors, the method comprising:
outputting, by a live photodiode exposed to a light source, a live signal;
outputting, by a reference photodiode proximate to the live photodiode and isolated from the light source, a reference signal; and
generating, by a controller, a compensated output signal by subtracting the reference signal from the live signal, wherein the controller comprises an operational amplifier configured to receive and amplify the live signal and receive and amplify the reference signal and wherein the compensated output signal compensates for error signals including dark current affected by temperatures experienced by the live photodiode, shunt resistance experienced by the live photodiode based on an interaction of the live photodiode with an operational amplifier input voltage offset voltage of the operational amplifier where the shunt resistance forms a voltage amplifier with an operational amplifier feedback resistor associated with the operational amplifier, an operational amplifier input offset voltage of the operational amplifier, and an operational amplifier input bias current of the operation amplifier.

16. The method of claim 15, further comprising alternating a photodiode switch between a first position to electrically connect the live photodiode to the controller and electrically isolate the reference photodiode from the controller, and a second position to electrically connect the reference photodiode to the controller and to electrically isolate the live photodiode from the controller.

17. The method of claim 16, wherein the photodiode switch alternates at a frequency that is between 100 hertz and 1 Megahertz.

18. The method of claim 15, wherein the live photodiode and the reference photodiode are both located in a gas turbine engine, and the live signal corresponds to a temperature of an airfoil of the gas turbine engine.

* * * * *